US011670392B2

(12) United States Patent
Avalur et al.

(10) Patent No.: US 11,670,392 B2
(45) Date of Patent: Jun. 6, 2023

(54) CIRCUIT FOR REDUCED CHARGE-INJECTION ERRORS

(71) Applicant: ams International AG, Jona (CH)

(72) Inventors: Gowri Krishna Kanth Avalur, Eindhoven (NL); Rahul Thottathil, Eindhoven (NL); Ravi Kumar Adusumalli, Eindhoven (NL)

(73) Assignee: AMS INTERNATIONAL AG, Rapperswil (CH)

( * ) Notice: Subject to any disclaimer, the term of this patent is extended or adjusted under 35 U.S.C. 154(b) by 0 days.

(21) Appl. No.: 17/433,585

(22) PCT Filed: Feb. 25, 2020

(86) PCT No.: PCT/EP2020/054862
§ 371 (c)(1),
(2) Date: Aug. 24, 2021

(87) PCT Pub. No.: WO2020/173918
PCT Pub. Date: Sep. 3, 2020

(65) Prior Publication Data
US 2022/0139476 A1    May 5, 2022

Related U.S. Application Data

(60) Provisional application No. 62/809,829, filed on Feb. 25, 2019.

(51) Int. Cl.
*G11C 27/02* (2006.01)
*G01J 1/44* (2006.01)
(Continued)

(52) U.S. Cl.
CPC .............. *G11C 27/026* (2013.01); *G01J 1/44* (2013.01); *H01L 27/14812* (2013.01); *H03K 17/6871* (2013.01)

(58) Field of Classification Search
CPC .... G11C 27/026; G01J 1/44; H01L 27/14812; H03K 17/6871
See application file for complete search history.

(56) References Cited

U.S. PATENT DOCUMENTS 5,550,503 A * 8/1996 Garrity .............. H03K 17/6872
                                                    327/437
5,847,594 A * 12/1998 Mizuno .................. H04N 5/335
                                                    327/345

(Continued)

OTHER PUBLICATIONS

International Search Report and Written Opinion dated Apr. 24, 2020 for corresponding International Application No. PCT/EP2020/054862.

(Continued)

*Primary Examiner* — Thanh Luu
*Assistant Examiner* — Monica T Taba
(74) *Attorney, Agent, or Firm* — Tarolli, Sundheim, Covell & Tummino LLP

(57) ABSTRACT

A switch circuit for use in a single-ended switched-capacitor circuit for front-end circuitry of a sensor device is disclosed. The switch circuit comprises a first transistor and a second transistor having a same channel-type as the first transistor. A first node is connected to a source of the first transistor and a drain of the second transistor and a second node is connected to a drain of the first transistor and a source of the second transistor. Also disclosed is a sampling circuit comprising the switch circuit and a sampling capacitor, wherein the switch circuit is configurable to electrically couple the sampling capacitor to an integrator circuit or to a voltage reference. An integrated circuit device and a light to frequency converter or light sensor comprising the switch circuit is also disclosed.

17 Claims, 15 Drawing Sheets

(51) Int. Cl.
*H01L 27/148* (2006.01)
*H03K 17/687* (2006.01)

(56) References Cited

U.S. PATENT DOCUMENTS

| | | | |
|---|---|---|---|
| 7,015,729 B1 | 3/2006 | Tursi | |
| 2003/0001666 A1* | 1/2003 | Watanabe | H03K 5/2481 |
| | | | 327/563 |
| 2003/0098722 A1* | 5/2003 | Jensen | G11C 27/026 |
| | | | 327/65 |
| 2009/0128199 A1* | 5/2009 | Abdelli | H03K 5/151 |
| | | | 327/144 |
| 2014/0232460 A1* | 8/2014 | Bardsley | H03F 1/3211 |
| | | | 330/252 |

OTHER PUBLICATIONS

Baker, R. Jacob, (2010) "CMOS Circuit Design, Layout, and Simulation", IEEE Series on Microelectronic Systems, Third Edition, John Wiley & Sons, Inc. XP055684218, pp. 86, 96-98, 131, and 375.

* cited by examiner

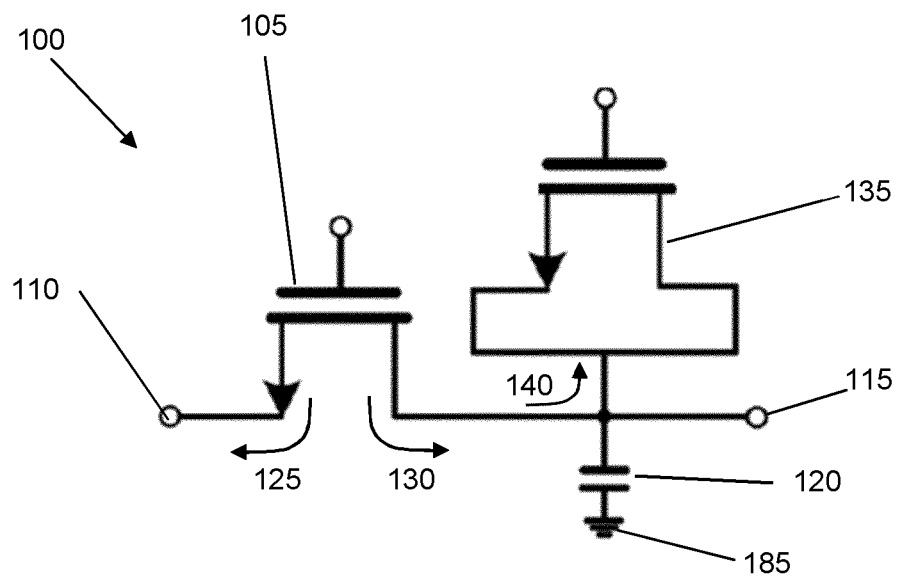
Figure 1a – PRIOR ART
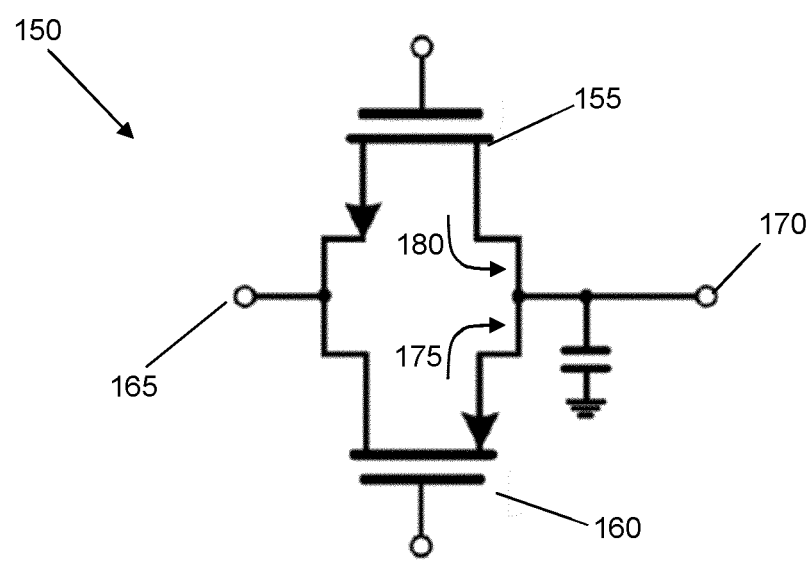
Figure 1b – PRIOR ART

CIRCUIT FOR REDUCED CHARGE-INJECTION ERRORS

RELATED APPLICATIONS

The present invention is a U.S. National Stage under 35 USC 371 patent application, claiming priority to Serial No. PCT/EP2020/054862, filed on 25 Feb. 2020; which claims priority from U.S. Provisional Application No. 62/809,829 filed 25 Feb. 2019, the entirety of both of which are incorporated herein by reference.

BACKGROUND

This disclosure relates to a single-ended switched-capacitor circuit for use in, for example, front-end circuitry of a sensor device.

Switched capacitor circuits are commonly employed in sampling circuits, such as sampling circuits configured to sample a signal from a sensor or the like. A variety of analogue and mixed-signal integrated circuits, such as analogue-to-digital converters, digital-to-analogue converters, analogue filters, and sample and hold circuits, comprise switched capacitor circuits.

Typical switched capacitor circuits may comprise one or more transistors, such as Metal-Oxide Semiconductor Field Effect Transistors (MOSFETs), configurable to couple a signal to a circuit configured to sample the signal, e.g. a sampling circuit.

However, known drawbacks of employing MOSFETS in switched capacitor circuits include the detrimental effects of charge-injection, in particular by means of clock feed-through and/or channel charge-injection. Both clock feed-through and channel charge-injection can introduce unwanted an charge into one or more nodes of a switched capacitor circuit which may, for example, resulting erroneous voltages being sampled at nodes of the circuit.

Clock feed-through may be caused by gate-source and gate-drain overlap capacitances of a MOSFET. As the MOSFET is switched off, for example by a transition of a clock signal coupled to the gate of the MOSFET, a capacitance connected to the source and/or drain of the MOSFET may be at least partly charged by a charge that is stored on the respective gate-source or gate-drain overlap capacitance. Such charge transfer may incur a measurable voltage change across an impedance coupled to the source or drain, and is generally known in the art as "clock feed through".

Charge-injection arises specifically from a charge that is accumulated and stored in the channel area of a MOSFET transistor when the MOSFET is switched on. When the MOSFET switches off, e.g. by a transition of a clock signal coupled to the gate of the MOSFET, the stored channel charge flows from the channel area and is injected into source and drain terminals MOSFET.

A distribution of the injected charge across the source and drain of the MOSFET depends, at least in part, upon characteristics of the source and drain terminals of the MOSFET, and impedances as seen by the source and drain terminals of the MOSFET. Such characteristics and impedances can be extremely difficult to accurately model and can vary depending upon characteristics and usage of the circuit in which the MOSFET is instantiated. As such, existing techniques to compensate for the effects of charge-injection are limited in their accuracy and effectiveness.

It is therefore an aim of at least one embodiment of at least one aspect of the present disclosure to obviate or at least mitigate at least one of the above identified shortcomings of the prior art.

SUMMARY

The present disclosure relates to a switch circuit which for use in a single-ended switched-capacitor circuit for front-end circuitry of a sensor device.

According to a first aspect of the disclosure, there is provided a switch circuit comprising: a first transistor; and a second transistor having a same channel-type as the first transistor; wherein a first node is connected to a source of the first transistor and a drain of the second transistor and wherein a second node is connected to a drain of the first transistor and a source of the second transistor.

Advantageously, such an arrangement provides a substantially symmetric switch that helps to ensure that a total charge, i.e. a total injected charge, exiting from both sides of the switch circuit is substantially the same. Advantageously, by ensuring that the injected charge is substantially the same at both sides of the switch circuit, the injected charge can be effectively compensated for by the use of 'dummy switches', as described in more detail below.

Beneficially, the disclosed switch circuit can be used in addition to, or as an alternative to, existing state-of-the art techniques for reducing the effects of injected charge, such as reducing a slew rate of the switch driver and/or reducing a voltage swing on the switch circuit. The disclosed switch circuit can be used in, for example single-ended switched capacitor front-end circuits, for light sensors such as Ambient Optical Sensors (AOS).

A third node may be connected to a gate of the first transistor and to a gate of the second transistor. The third node may be coupled to an enable signal for configuring the first transistor and the second transistor to selectively couple the first node to the second node.

The first transistor may be configured to exhibit substantially the same electrical characteristics as the second transistor.

The first transistor may comprises substantially a same gate area as the second transistor.

The switch circuit may comprise a third transistor. A source of the third transistor and a drain of the third transistor may be connected to the first node or to the second node.

The switch circuit may comprise a fourth transistor. A source of the fourth transistor and a drain of the fourth transistor may be connected to the other of the first node or the second node.

A gate of the third transistor may be coupled to signal corresponding to an inverse of the enable signal.

A gate of the fourth transistor may be coupled to signal corresponding to an inverse of the enable signal.

The channel-type is n-channel.

According to a second aspect of the disclosure, there is provided a sampling circuit comprising a first switch circuit according to the first aspect and a sampling capacitor. The first switch circuit is configurable to electrically couple the sampling capacitor to an integrator circuit or to a voltage reference.

To operate higher-order light-sensor front-end architectures with reduced noise, it may be necessary to use synchronous sampling in the front-end. For a sensor, such as a light sensor, where a sensed signal is very low or, for example, the sensor is under relatively dark conditions, charge injection may be a main source of error, thus increasing a 'dark current' of the light sensor. Advantageously, a sampling circuit comprising the disclosed switch circuit may reduce charge injection of such a synchronous front-end such that the 'dark current' may be comparable to existing first-order asynchronous architectures, with an added benefit of lower noise due to second order noise shaping.

Furthermore, the disclosed switch circuit may be simpler and/or incur less area overhead and/or incur a lower power overhead relative to other techniques for reducing errors due to chare injection. As such, the disclosed switch circuit may enable low-area single-ended switched capacitor front-end architectures for sensor interfaces.

Furthermore, the disclosed switch circuit may also be used to build a very high gain, high sensitivity, low dark count light sensor front-end.

In general, the disclosed switch circuit may be advantageous to a single-ended switched-capacitor circuit front-end with low input signal where charge-injection is problematic.

The disclosed switch circuit may also be utilised in sensor front-ends where the photo-current is particularly small. Advantages of the disclosed switch circuit may include a reduced charge injection output code, effectively resulting in a reduced dark count in higher (second) order modulators. Advantages of the disclosed switch circuit may include a reduced error in the integrator output voltage. Advantages of the disclosed switch circuit may include relatively little reduction in a light output, and close to zero reduction in a light output for higher order modulators.

The sampling circuit may comprise a second switch circuit according to the first aspect.

The second switch circuit may be configurable to electrically couple the sampling capacitor to the other of the integrator circuit or the voltage reference.

The sampling circuit may comprise the integrator circuit. The integrator circuit may comprise an operational-amplifier coupled to a feedback capacitor.

According to a third aspect of the disclosure, there is provided an integrated circuit device comprising at least one switch circuit according to the first aspect.

The first and second transistors of the at least one switch circuit may be arranged substantially linear-symmetrically relative to one another.

The first and second transistors of the at least one switch circuit may be arranged substantially point-symmetrically relative to one another.

The integrated circuit device may comprising a plurality of further transistors.

Each of the plurality of further transistors have a gate area, wherein the first and second transistors of the at least one switch circuit may each have a gate area approximately equally to half of the gate area of each transistor of the plurality of further transistors.

The first transistor of the at least one switch circuit may be fabricated with source and drain terminals that are distinct from fabricated source and drain terminals of the second transistor of the at least one switch circuit.

According to a fourth aspect of the disclosure, there is provided a light to frequency converter or light sensor comprising at least one light-sensitive element and at least one sampling circuit according to the second aspect. The at least one sampling circuit is configurable to sample a signal from the at least one light-sensitive element.

Ambient light optical sensors (AOS), such as ambient optical sensors comprising light to frequency converters or light sensors as disclosed herein, may employ multiple switches at a virtual node of an integrator amplifier. Any switching at the virtual node may result in a current injection, e.g. a gain or loss in an accumulated charge to be sampled, which may result in an error in a measured voltage (or amount of stored charge), wherein the measured voltage corresponds to a light measurement.

The switch circuit disclosed herein may allow for a reduction in such charge-injection by permitting effective and reliable charge-injection compensation. Therefore, benefits of the disclosed switch circuit, when implemented in an AOS, such as an AOS comprising light to frequency converters as disclosed herein, are to reduce an accuracy of low-light measurements, and to substantially reduce a charge-injection error (dark count) in second or higher order modulators. Furthermore, the switch circuit disclosed herein may be relatively-easily integrated into existing architectures and designs.

According to a fifth aspect of the disclosure, there is provided an optical device comprising at least one light to frequency converter or light sensor according to the fourth aspect, wherein the optical device is at least one of: a cellular telephone, a camera, an image-recording device; and/or a video recording device.

According to a sixth aspect of the present disclosure there is provided an apparatus comprising a switch circuit including first and second transistors, wherein a source of the first transistor is connected to a drain of the second transistor, and wherein a drain of the first transistor is connected to the source of the second, thereby mitigating asymmetry between source and drain terminals.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects of the present disclosure will now be described, by way of example only, with reference to the accompanying drawings, wherein:

FIG. 1a depicts a prior art switch circuit comprising circuitry for compensating for charge-injection;

FIG. 1b depicts a further prior art switch circuit configured to compensate for charge-injection;

FIG. 3b depicts a schematic representation of a layout of the charge-injection compensated circuit of FIG. 3a;

FIG. 4b depicts a timing diagram corresponding to the sampling circuit of FIG. 4a;

FIG. 5 depicts simulated performance of a switch circuit according to an embodiment of the disclosure, relative to the prior art circuit of FIG. 1a;

FIGS. 8-g depict a layout of the charge-injection compensated circuit of FIG. 3a.

DETAILED DESCRIPTION OF DRAWINGS

Figure 2:
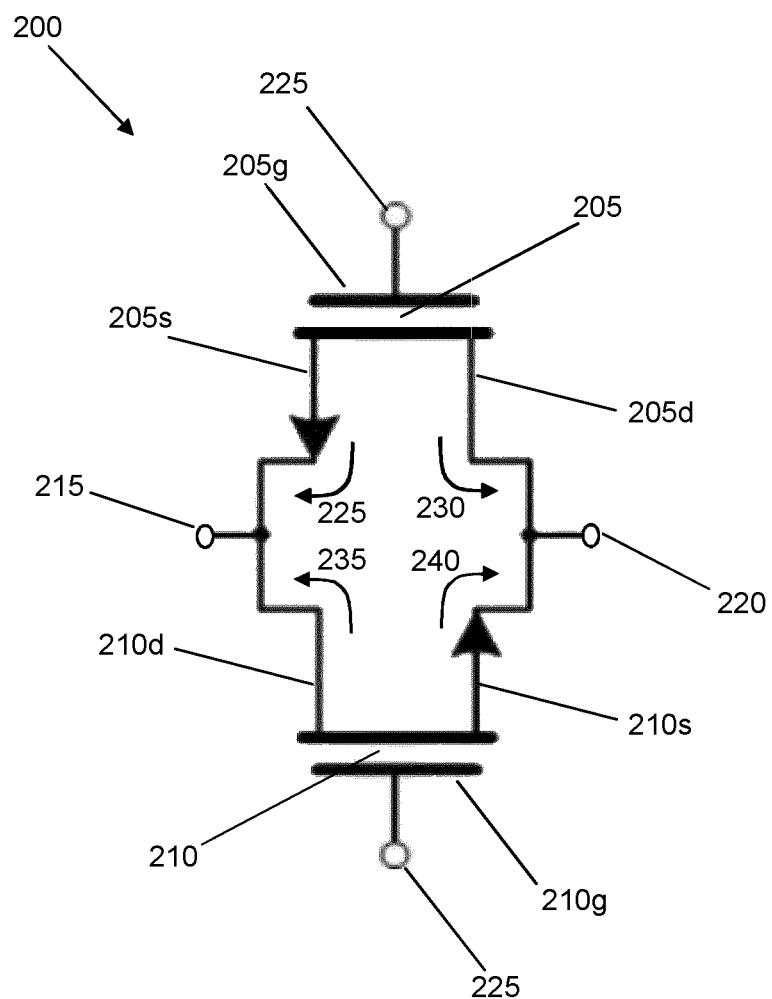
FIG. 2 depicts a switch circuit according to an embodiment of the disclosure.

FIG. 1a depicts a prior art circuit 100 comprising circuitry for compensating for charge-injection. The circuit 100 comprises a first transistor 105, which for purposes of example is an NMOS transistor. A source of the transistor 105 is connected to an input node 110 of the circuit 100. A drain of the first transistor 105 is connected to an output node 115 of the circuit 100. A capacitor 120 is connected between the drain of the first transistor 105 and a voltage reference 185. In the example of FIG. 1a, the voltage reference is a ground reference, e.g. 0 volts.

The first transistor 105 is configured to operate as a switch. That is, by asserting a signal at a gate of the first transistor 105, e.g. by increasing the gate voltage above the source voltage, the first transistor 105 can be switched on, effectively coupling the input node 110 to the output node 115 of the circuit 100, and thus charging capacitor 120. That is, by asserting a signal at a gate of the first transistor 105, current may flow from the source to the drain of the first NMOS transistor 105, thus charging the capacitor 120 to a voltage dependent upon a voltage present at the input node 110, less any voltage drop across the source-drain of the first transistor 105.

Similarly, by negating the signal at the gate of the first transistor 105, the first NMOS transistor can be switched off, effectively decoupling the input node 110 from the output node 115.

As such, the circuit 100 may be operated as a rudimentary switched capacitor circuit. In practice, the output node 115 of such a circuit 100 may be coupled to measurement circuitry, such as an integrator circuit or the like (not shown).

As described above, when the first transistor 105 is switched off, the first transistor 105 may inject a charge 125, 130 into the circuit 100, thus affecting an amount of charge accumulated at the capacitor 120. In the example of FIG. 1a, charge 125 is injected into the circuit 100 from the source of the first transistor 105 and charge 130 is injected into the circuit 100 from the drain of the first transistor 105.

A distribution of the injected charge 125, 130 between the source and drain of the first transistor 105 depends, at least in part, upon electrical characteristics of the source and drain of the transistor 105, an impedance at the input node 115 of the circuit 100 and an impedance at the output node 115 of the circuit 100. For example, in some instances, the injected charge may be distributed equally between the source and drain of the first transistor 105 in the saturation region, e.g. partitioned 50/50. In other instances, the injected charge may be distributed unequally between the source and drain of the first transistor 105, e.g. partitioned approximately 40/60, or the like.

The circuit 100 comprises a second transistor 135. The second transistor 135 comprises the same channel-type as the first transistor 105. In the example shown, the channel type of the second transistor 135 is n-channel, e.g. the second transistor is an NMOS transistor. A source and a drain of the second transistor are connected to the output node 115 of the circuit 100. In such a configuration, the second NMOS transistor 135 may generally be known in the art as a "dummy switch". A gate of the second transistor 135 is connected to a complement of the signal at the gate of the first transistor 105. For example, in instances wherein the signal at the gate of the first transistor 105 is a clock signal, the signal at the gate of the second transistor 135 is a complementary clock signal. As such, when the second transistor is switched on, the first transistor is switched off, and vice versa. In this manner, the second transistor 135 can be configured to absorb the charge 130 injected by the first transistor 105, as depicted as charge 140 in FIG. 1b.

Dimensions of the second transistor 135 are typically selected such that a total charge absorbed by the second transistor 135 is equal to half of the total charge 125, 130 injected into the circuit 100 by the first transistor 105. For example, a width of the channel of the second transistor 135 is typically selected to be half of the width of the channel of the first transistor 105. On an assumption that the injected charge 125, 130 from the first transistor 105 is equally distributed between the source and drain of the first transistor 105, the second transistor 135 can effectively compensate for charge 130 injected into the circuit 100 from the drain of transistor 105 by absorbing charge 140.

Unfortunately, the assumption of an equal distribution of injected charge 125, 130 between source and drain of the first transistor 105 is generally invalid, and therefore the second transistor 135 may over or under compensate for the injected charge 130.

FIG. 1b depicts a further prior art circuit 150 comprising circuitry for compensating for charge-injection. The circuit 150 comprises complementary transistors: a PMOS transistor 160 and an NMOS transistor 155.

A source of the NMOS transistor 155 is connected to an input node 165 of the circuit 150. A drain of the NMOS transistor 105 is connected to an output node 170 of the circuit. A gate of the NMOS transistor 155 is connected to a signal, such as a clock signal.

A source of the PMOS transistor 160 is connected to the output node 170 and a drain of the PMOS transistor 160 is connected to the input node 165. A gate of the PMOS transistor 160 is connected to a complement of the signal coupled to the gate of the NMOS transistor 155, such as a complementary clock signal.

In use, the PMOS transistor 160 may inject a charge 175 that is comparable in magnitude yet opposite to a charge 180 that is injected by the NMOS transistor 155. As such, the charge-injection effect of the PMOS transistor 160 and the NMOS transistor 155 effectively cancel each other out. However, in practice, such a complementary transistor arrangement may provide compensation for charge-injection over only a limited range of input signal. Furthermore, compensation for the effects of clock-feed through are generally limited because of differences between the gate-drain overlap capacitance of PMOS and NMOS transistors.

In addition to the 'dummy' switches as depicted in FIG. 1a and the complementary switches as depicted in FIG. 1b, other common methods for cancelling or mitigating switch-induced errors may include the use of differential switching, which can be effective to an extent due to an inherent symmetry. However, while such techniques may result in a reduction in charge-injection, a residual accuracy of a sampling circuit employing such techniques may be insufficient for high-precision single-ended switch capacitor circuits, in particular high-precision switched capacitor circuits where even a few microvolts can effect a performance of an overall system.

FIG. 2 depicts a switch circuit 200 according to an embodiment of the disclosure. The circuit 200 comprises a first transistor 205 and a second transistor 210. The second transistor 210 has the same channel-type as the first transistor 205. In the example embodiment of FIG. 2, the first and second transistors comprise n-channels, e.g. are NMOS transistors. It will be appreciated that in alternative embodiments, the first and second transistors may alternatively comprise PMOS transistors.

A first node 215 is connected to a source 205s of the first transistor 205 and a drain 210d of the second transistor 210. The first node 215 may be an input node to the circuit 200, e.g. a node at which a voltage signal to be sampled may be applied. A second node 220 is connected to a drain 205d of the first transistor 205 and a source 210s of the second transistor 210. The first node 215 may be considered as an input to the circuit 200. The second node 220 may be considered as an output from the circuit 200.

In the example embodiment of FIG. 2, a third node 245 is connected to a gate 205g of the first transistor 205 and, directly or indirectly, to a gate 210g of the second transistor 210 such that a signal, e.g. a clock signal, can be simultaneously applied to both gates 205g, 210g. As such, both the first transistor 205 and the second transistor 210 can be simultaneously switched on or off by the signal applied to the gates 205g, 210g.

When the first transistor 205 is switched off, the first transistor 205 may inject a charge 225, 230 into the circuit 200, e.g. a charge 225 towards the first node 215 and a charge 230 towards the second node 220. In the example embodiment of FIG. 2, charge 225 is injected from the source 205s of the first transistor 205 into the first node 215 and charge 230 is injected from the drain 205d of the first transistor 205 into the second node 220

As previously described with reference to the prior art circuit 100 of FIG. 1a, a distribution of the injected charge 225, 230 between the source 205s and drain 205d of the first transistor 205 is, in practice, unlikely to be evenly balanced, e.g. distributed 50/50.

When the second transistor 210 is switched off, the second transistor 210 may inject a charge 235, 240 into the circuit 200. In the example embodiment of FIG. 2, charge 240 is injected from the source 210s of the second transistor 210 into the second node 220 and charge 235 is injected from the drain 210d of the second transistor 210 into the first node 215.

As previously described with reference to the prior art circuit 100 of FIG. 1a, a distribution of the injected charge 225, 230 between the source 210s and drain 210d of the second transistor 210 is, in practice, unlikely to be evenly balanced, e.g. distributed 50/50.

However, because of the flip-around arrangement of the first and second transistors 205, 210 relative to one another, i.e. because the first and second transistors 205, 210 are connected source 205s to drain 210d and drain 205d to source 210s, the combined injected charge from both transistors 205, 210 as seen at the first node 215 and second node 220 may be substantially balanced, e.g. symmetrical. That is, any inherent asymmetry between the charge injected from the source 205s and drain 205d of the first transistor 205 is, to at least some extent, mitigated by charge injected from the source 210s and drain 210d of the second transistor 210. Furthermore, the first and second transistors 205, 210 may be sized, e.g. have gate lengths and/or gate widths, such that an area of the gates of each of the first and second transistors 205, 210 is approximately half that of other transistors in a circuit in which the switch circuit 200 may be embodied, as described in more detail below. In this manner, a total charge injected by the switch circuit 200 comprising two transistors 205, 210 may be comparable in magnitude to a total charge injected by a single transistor in an alternative circuit, such as single transistor 105 in FIG. 1a.

Therefore, while the circuit 200 may not directly reduce an overall amount of charge injected into either the first node 215 or the second node 220 relative to the prior art solution, the circuit 200 does provide an advantageous effect of more evenly and reliably distributing the injected charge 225, 230, 235, 240 across the first node 215 and the second node 220. As such, the effects of the injected charge may be more effectively compensated for, as described below with reference to FIG. 3a.

Figure 3A:
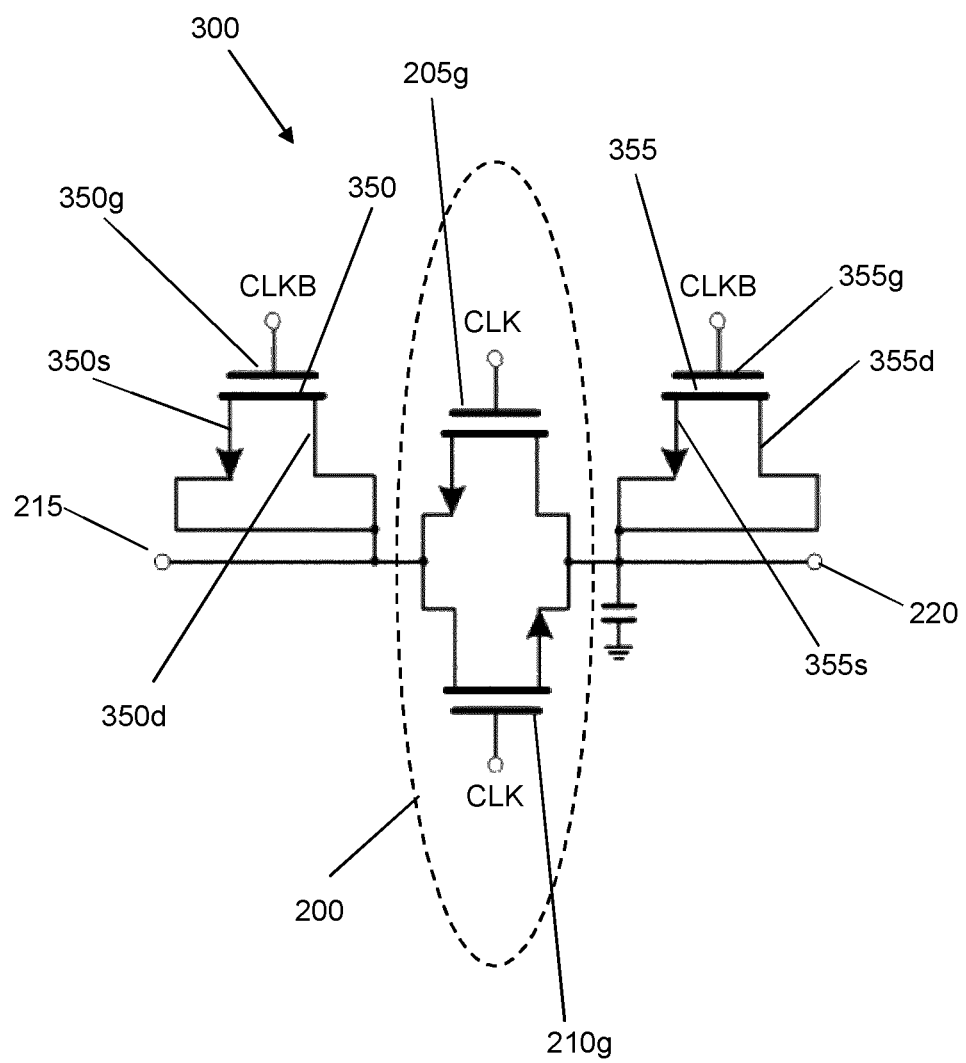
FIG. 3a depicts a charge-injection compensated circuit comprising the embodiment of the switch circuit of FIG. 2.

FIG. 3a depicts a charge-injection compensated circuit, generally denoted 300, comprising an embodiment of the switch circuit 200 of FIG. 2 made up of a flip-around arrangement of first transistor 205 and second transistor 210 relative to one another.

The circuit also comprises "dummy switches", as exemplified in FIG. 1a, configured to compensate for charge-injection from switch circuit 200. Specifically, the charge-injection compensated circuit 300 comprises a third transistor 350, wherein a source 350s of the third transistor and a drain 350d of the third transistor 350 are connected to the first node 215. As such, the third transistor 350 is configured as a "dummy switch" to compensate for charge 225, 235 injected into the first node 215 by the switch circuit 200.

Similarly, the charge-injection compensated circuit 300 comprises a fourth transistor 355, wherein a source 355s of the fourth transistor and a drain 355d of the fourth transistor is connected to the second node 220. As such, the fourth transistor 355 is configured as a "dummy switch" to compensate for charge 230, 240 injected into the second node 220 by the switch circuit 200.

In the example embodiment of FIG. 3, the gate 205g of the first transistor 205 and the gate 210g of the second transistor 210 of the switch circuit 200 are coupled to a clock signal, denoted CLK.

The gate 350g of the third transistor 350 and the gate 355g of the fourth transistor 355 are coupled to a complementary clock signal, denoted CLKB. Signal CLK represents the complement of signal CLKB. As such, when the first and second transistors 205, 210 are switched on, e.g. the signal CLK being a logic 'high' with a voltage substantially greater than the source voltage of the first and second transistors 205, 210, the third and fourth transistors 350, 355 are switched off, e.g. the signal CLKB being a logic 'low' with a voltage that does not exceed the source voltage of the third and fourth transistors 350, 355, and vice versa.

In this manner, the third transistor 350 may be configured to absorb the charge injected into the first node 215 by the switch circuit 200 and the fourth transistor 355 may be configured to absorb the charge injected into the second node 220 by the switch circuit 200. In an embodiment, the third transistor 350 and the fourth transistor 355 each comprise a gate area comparable to, or substantially the same as, a gate area of each of the first transistor 205 and the second transistor 210.

It will be appreciate that in some embodiments, and in particular in embodiments wherein the first node 215 is a low impedance node, e.g. has a low impedance load, the third transistors 350 may not be implemented.

Figure 3B:
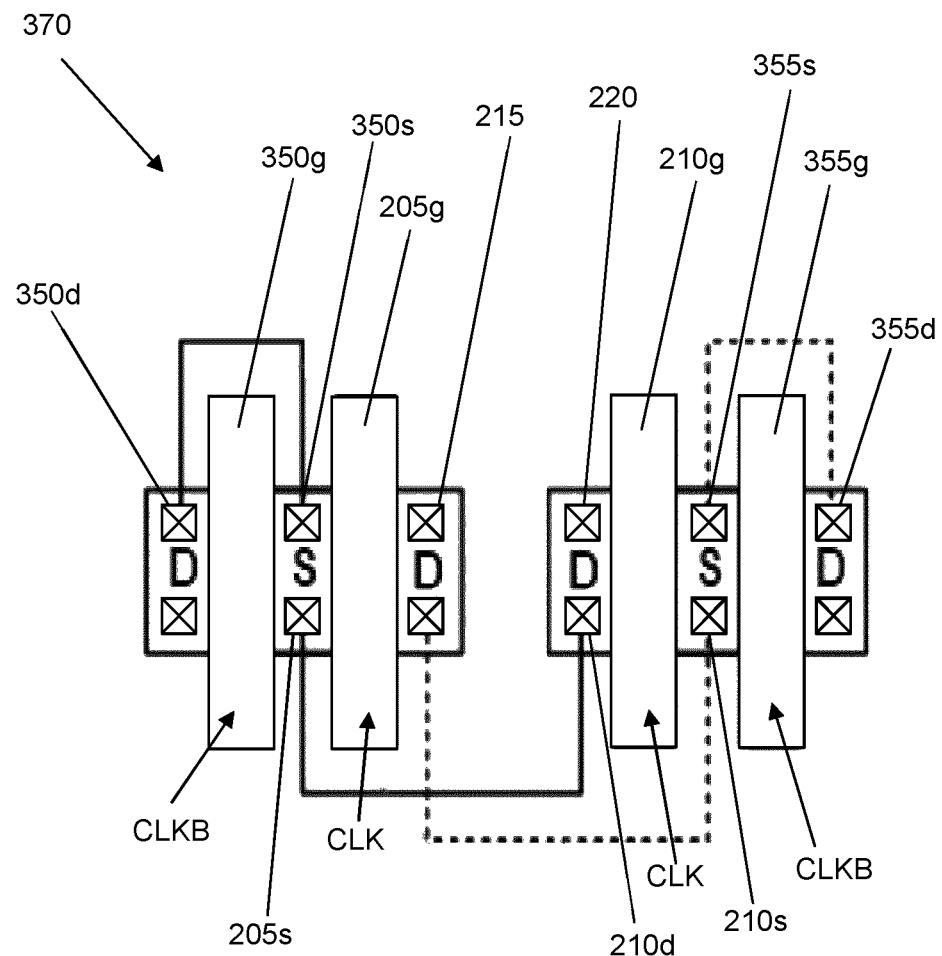

FIG. 3b depicts a schematic representation of a layout 370 of the charge-injection compensated circuit of FIG. 3a. The representation of the layout 370 corresponds to a layout in an integrated circuit, such as a semiconductor device.

It will be appreciated that FIG. 3b is a schematic representation of the layout 370, and in practice, the transistors 205, 210, 350, 355 may be laid out in a substantially linear-symmetrical or point-symmetrical arrangement. In particular, the first transistor 205 and the third transistor 350 may be laid out in a substantially linearly symmetrical or point-symmetrical arrangement relative to the second transistor 210 and the fourth transistor 355.

By providing a substantially symmetrical arrangement, a total charge injected into the first node 215 by the source 205s of first transistor 205 and the drain 210d of the second transistor 210 and will be substantially the same as a total charge injected into the second node 220 by the drain 205d of the first transistor 205 and the source 210s of the second transistor 210. As such, the injected charge can be accurately and reliably compensated for by "dummy switches" formed from third transistor 350 and fourth transistor 355.

Furthermore, during layout of at least the first transistor 205 and the second transistor 210, and optionally also of the third transistor 350 and/or fourth transistor 355, any routing between the transistors 205, 210, 350, 355, is also substantially symmetrical to mitigate any influence of asymmetric parasitic capacitance and/or inductance in the circuit. For example, routing from the drain 205d of the first transistor 205 and routing from the source 210s of the second transistor 210 towards the second node 220 is substantially symmetrical and/or matched to ensure that parasitic effects of any such routing does not introduce any asymmetry to the charge injected from the drain 205d of the first transistor and the source 210s of the second transistor 210 to the second node 220.

Similarly, routing from the source 205s of the first transistor 205 and routing from the drain 210d of the second transistor 210 towards the first node 215 may be substantially symmetrical and/or matched to ensure that parasitic effects of any such routing does not introduce any asymmetry to the charge injected from the source 205s of the first transistor and the drain 210d of the second transistor 210 to the first node 220.

In comparison to the prior art circuit, for example FIG. 1a which comprises a single first transistor 105 configured to operate as a switch, the switch circuit 200 of the present disclosure comprises two transistors 205, 210, effectively replacing a single 'main' switching transistor 105 with two transistors 205, 210. The two transistors 205, 210 comprise, e.g. are fabricated to have, substantially equivalent dimensions.

In an example embodiment, circuit 200 and/or circuit 300 may be implemented in a further circuit comprising a plurality of further transistors. For example, the plurality of further transistors may form digital logic, or the like. Each transistor of the plurality of further transistors may comprise, e.g. be fabricated to have, particular dimensions. For example, each transistor of the plurality of further transistors may have a gate width W and a gate length L. In contrast, the first transistor 205 and second transistor 210 of circuit 200 and/or circuit 300 may comprise gates with an area approximately equally to half of an area of each gate of the plurality of further transistors. That is, the first transistor 205 and second transistor 210 of circuit 200 and/or circuit 300 may comprise gates with a gate width W/2, e.g. half the gate width of gate width W of each of the gates of the plurality of further transistors. Alternatively, the first transistor 205 and second transistor 210 of circuit 200 and/or circuit 300 may comprise gates with a gate length L/2, e.g. half the gate length of gate length L of each of the gates of the plurality of further transistors. As such, circuit 200 and/or circuit 300 may contribute substantially a same die area and cost to the device as, for example, a circuit comprising a single 'main' transistor 105 such as exemplified in prior art circuit of FIG. 1a. For example, in one embodiment, the gates of the first transistor 205 and second transistor 210 may each have a width of approximately 500 nanometres and a length of approximately 350 nanometres. In contrast, other transistors in a device in which the switch circuit 200 may be implemented may have a gate width of 1000 nanometres and a length of approximately 350 nanometres.

That is, to create a circuit 200 embodying the present disclosure, a gate of a transistor is, effectively, broken down into two substantially equal 'fingers', as exemplified by gates 205g and 210g depicted in FIG. 3b, wherein one finger, e.g. gate 210g is flipped around relative to the other 'finger', e.g. gate 205g, such that a source 205s associated with the one finger, e.g. gate 210g connects to a drain 205d associated with the other 'finger', e.g. gate 205g, and vice versa. Beneficially, such an arrangement helps ensure a relative symmetry, e.g. symmetrical charge-injection, across the overall switch 200, 300.

Notably, in the example layout 370, there is no sharing of source and drain terminals. That is, the first transistor 205 is fabricated with source 205s and drain 205d terminals that are distinct from fabricated source 210s and drain 210d terminals of the second transistor 210 of the switch circuit 300.

This is because, during fabrication, the gates 205g, 210g are implanted using an angle of implantation that may result in asymmetric parasitic capacitance and impedance at the source and drain terminals. Thus, the layout 370 depicted in FIG. 3b, e.g. the provision of distinct source and drain terminals associated with each of the gates 205g, 210g, will provide better symmetry between source 205s, 210s and drain 205d, 210d capacitance of the first transistor 205 and second transistor 210 compared to a shared-drain and/or shared-source approach. That is, a layout of the switch circuit 200, such as the layout 370 depicted in FIG. 3b, should be configured to provide a substantially symmetrical routing parasitic across, in particular, the source 210s and drain 205d connected to second node 220, to mitigate or at least minimise any asymmetric charge-injection from the gates 205g, 210g to the second node 220.

In this manner, the first and second transistors 205, 210 can effectively provide a shadowing effect relative to one another, and the cross-coupled or 'flip-around' connection will ensure symmetry between the first and second transistors 205, 210.

Figure 4A:
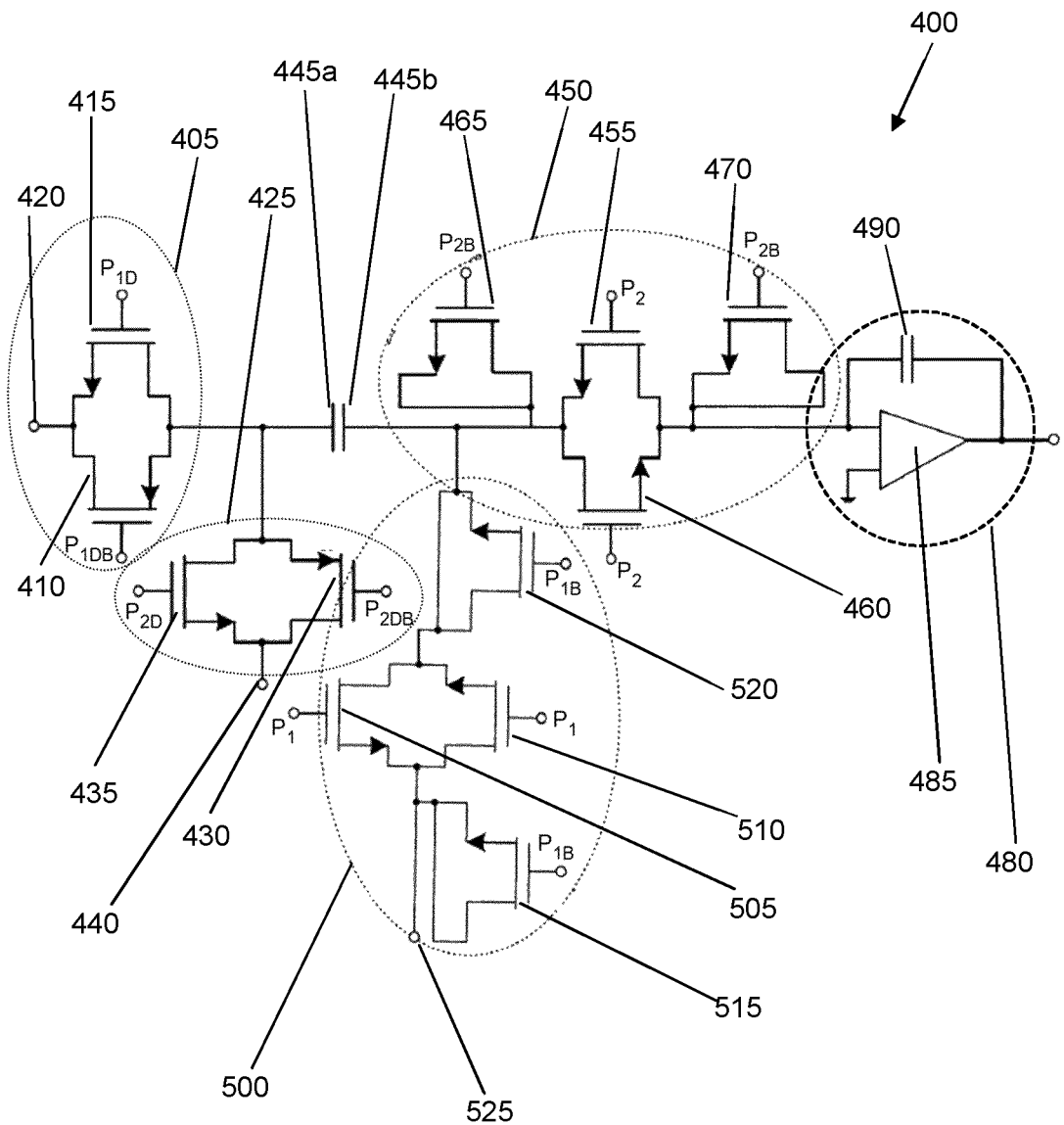
FIG. 4a depicts a sampling circuit according to an embodiment of the disclosure.

FIG. 4a depicts a sampling circuit 400 according to an embodiment of the disclosure. The sampling circuit 400 comprises a first switch circuit 405. The first switch circuit 405 comprises complementary transistors: a first PMOS transistor 410 and a first NMOS transistor 415. The first switch circuit 405 is a circuit for compensating for charge-injection as depicted in prior art example in FIG. 1b.

A source of the first NMOS transistor 415 is connected to an input node 420 to the circuit 400 and to a drain of the first PMOS transistor 410. A source of the first PMOS transistor 410 is connected to a first terminal 445a of a sampling capacitor 445 and to a drain of the first NMOS transistor 415.

A gate of the first NMOS transistor 415 is coupled to a signal $P_{1D}$. A gate of the first PMOS transistor 410 is coupled to a signal $P_{1DB}$. Signal $P_{1DB}$ corresponds to an inverse of signal $P_{1D}$. That is, signal $P_{1DB}$ is a complement of signal $P_{1D}$.

The sampling circuit 400 comprises a second switch circuit 425. The second switch circuit 425 comprises complementary transistors: a second PMOS transistor 430 and a second NMOS transistor 435. The second switch circuit 425 is a circuit for compensating for charge-injection as depicted in prior art example in FIG. 1b.

A source of the second NMOS transistor 435 is connected to a first voltage reference 440 and to a drain of the second PMOS transistor 435. A source of the second PMOS transistor 430 is connected to the first terminal 445a of the sampling capacitor 445 and to a drain of the second NMOS transistor 435.

In the example embodiment of FIG. 4a, the first voltage reference 440 is a common mode voltage. In other embodiments, the first voltage reference 440 may be a ground or earth reference, e.g. 0V.

The source of the second PMOS transistor 430 and the drain of the second NMOS transistor 435 are also connected to an output node of first switch circuit 405, e.g. to the source of the first PMOS transistor 410 and to the drain of the first NMOS transistor 415.

A gate of the second NMOS transistor 435 is coupled to a signal $P_{2D}$. A gate of the second PMOS transistor 430 is coupled to a signal $P_{2DB}$. Signal $P_{2DB}$ corresponds to an inverse of signal $P_{2D}$. That is, signal $P_{2DB}$ is a complement of signal $P_{2D}$.

The sampling circuit 400 comprises a third switch circuit 450. The third switch circuit 450 comprises a charge-injection compensated circuit as depicted in FIG. 3a.

The third switch circuit 450 comprises a first transistor 455 and a second transistor 460. The first transistor 455 and second transistor 460 are provided in the flip-around arrangement relative to one another, as described above with reference to FIG. 2.

The third switch circuit 450 circuit also comprises "dummy switches", as exemplified in FIG. 1a, configured to compensate for charge-injection from the first transistor 455 and the second transistor 460. Specifically, the third switch circuit 450 comprises a third transistor 465, wherein a source of the third transistor 465 and a drain of the third transistor 465 are connected a source of the first transistor 455 and a drain of the second transistor 460. As such, the third transistor 465 is configured as a first "dummy switch" to compensate for charge injected from the source of the first transistor 455 and the drain of the second transistor 460.

Similarly, third switch circuit 450 comprises a fourth transistor 470, wherein a source of the fourth transistor 470 and a drain of the fourth transistor 470 are connected to a drain of the first transistor 455 and a source of the second transistor 460. As such, the fourth transistor 470 is configured as a second "dummy switch" to compensate for charge injected from the drain of the first transistor 455 and the source of the second transistor 460.

A gate of the first transistor 455 and a gate of the second transistor 460 are coupled to a signal $P_2$. A gate of the third transistor 465 and a gate of the fourth transistor 470 are coupled to a signal $P_{2B}$. Signal $P_{2B}$ corresponds to an inverse of signal $P_2$. That is, signal $P_{2B}$ is a complement of signal $P_2$.

The source of the first transistor 455, the drain of the second transistor 460, and the source and drain of the third transistor 465, e.g. the first dummy switch, are connected to a second terminal 445b of the sampling capacitor 445.

The drain of the first transistor 455, the source of the second transistor 460, and the source and drain of the fourth transistor 470, e.g. the second dummy switch, are connected to an integrator circuit 480. The integrator circuit comprises an operational amplifier 485 coupled to a feedback capacitor 490.

It will be appreciated the integrator circuit 480 comprising the operational amplifier 485 and the feedback capacitor 490 is shown for purposes of example only, and that additional or alternative circuitry, such as at least one of many types of analogue to digital converters known in the art, may be implemented to sample a voltage level present at an output from the third switch circuit 450, e.g. at the drain of the first transistor 455 and the source of the second transistor 460.

The sampling circuit 400 comprises a fourth switch circuit 500. The fourth switch circuit 500 also comprises a charge-injection compensated circuit as depicted in FIG. 3a.

The fourth switch circuit 500 comprises a fifth transistor 505 and a sixth transistor 510. The fifth transistor 505 and sixth transistor 510 are provided in the flip-around arrangement relative to one another, as described above with reference to FIG. 2.

The fourth switch circuit 500 circuit also comprises "dummy switches", as exemplified in FIG. 1a, configured to compensate for charge-injection from the fifth transistor 505 and the sixth transistor 510. Specifically, the fourth switch circuit 500 comprises a seventh transistor 515, wherein a source of the seventh transistor 515 and a drain of the seventh transistor 515 are connected a source of the fifth transistor 505 and a drain of the sixth transistor 510. As such, the seventh transistor 515 is configured as a third "dummy switch" to compensate for charge injected from the source of the fifth transistor 505 and the drain of the sixth transistor 510.

Similarly, the fourth switch circuit 500 comprises an eighth transistor 520, wherein a source of the eighth transistor 520 and a drain of the eighth transistor 520 are connected to a drain of the fifth transistor 505 and a source of the sixth transistor 510. As such, the eighth transistor 520 is configured as a fourth "dummy switch" to compensate for charge injected from the drain of the fifth transistor 505 and the source of the sixth transistor 510.

A gate of the fifth transistor 505 and a gate of the sixth transistor 510 are coupled to a signal $P_1$. A gate of the seventh transistor 515 and a gate of the eighth transistor 520 are coupled to a signal $P_{1B}$. Signal $P_{1B}$ corresponds to an inverse of signal $P_1$. That is, signal $P_{1B}$ is a complement of signal $P_1$.

The source of the fifth transistor 505, the drain of the sixth transistor 510, and the source and drain of the seventh transistor 515, e.g. the third dummy switch, are connected to a second voltage reference 525. In the example embodiment of FIG. 4a, the second voltage reference 525 is a ground or earth reference, e.g. 0V.

The drain of the fifth transistor 505, the source of the sixth transistor 510, and the source and drain of the eighth transistor 520, e.g. the fourth dummy switch, are connected to the second terminal 445b of the sampling capacitor 445.

A general of operation of the sampling circuit 400 is as follows. When the sampling circuit 400 is configured in a sampling mode, the first switch circuit 405 and the fourth switch circuit 500 are 'on', and the second switch circuit 425 and the third switch circuit 450 are 'off'. In this configuration, a voltage across the sampling capacitor 445 can track a voltage at the input node 420 to the circuit, while the integrator circuit 480, namely the operational amplifier 485 together with the feedback capacitor 490, maintains a previously sampled voltage.

To transition the sampling circuit 400 to an integration mode, in a first step the first switch circuit 405 and the fourth switch circuit 500 are switched 'off'. Then, in a subsequent step the second switch circuit 425 and the third switch circuit 450 are switched 'on'.

Figure 4B:
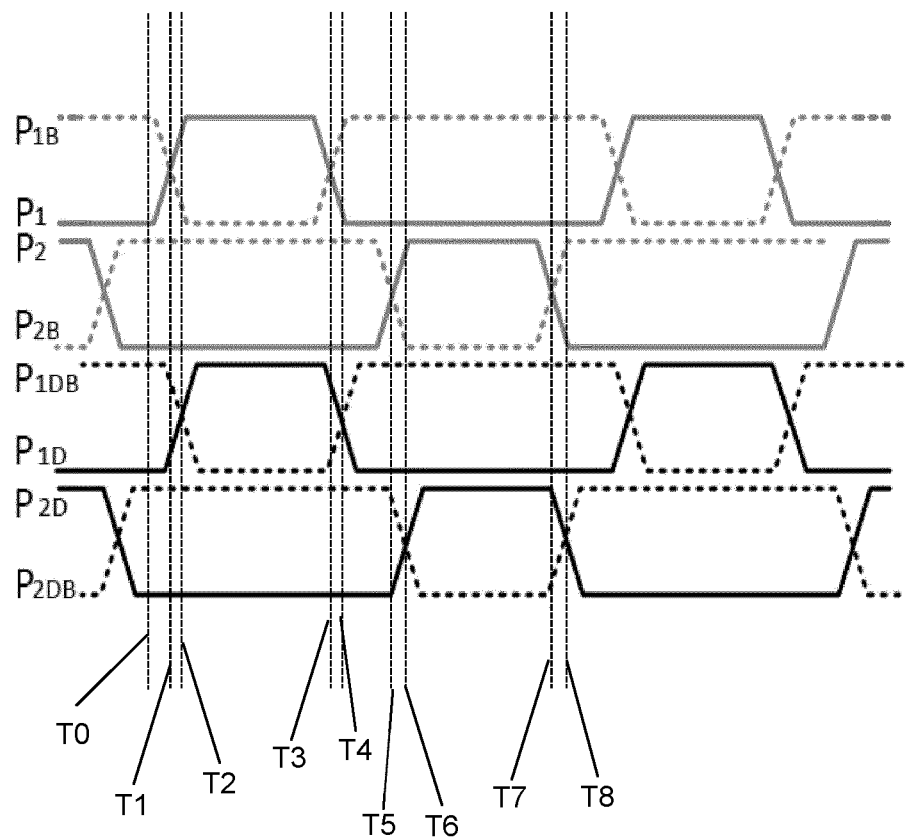

This operation is described in more detail with reference to the timing diagram of FIG. 4b.

At an initial time T0, the signal $P_1$ is set to a low level, e.g. 0V, thus switching the fourth switch circuit 500 off, e.g. by switching the fifth transistor 505 and the sixth transistor 510 off. At the initial time $T_0$, the signal $P_2$ is also set to a low level, e.g. 0V, thus switching the third switch circuit 450 off, e.g. by switching the first transistor 455 and the second transistor 460 off. At the initial time T0, the signal $P_{1D}$ is also set to a low level, e.g. 0V, thus switching the first switch circuit 405 off, e.g. by switching the first PMOS transistor 410 and the first NMOS transistor 415 off. At the initial time T0, the signal $P_{2D}$ is also set to a low level, e.g. 0V, thus switching the second switch circuit 425 off, e.g. by switching the second PMOS transistor 435 and the second NMOS transistor 430 off.

At a first time T1, the signal $P_1$ is set to a high level, e.g. a logic high level, thus switching the fourth switch circuit 500 on. In a preferred embodiment, at a subsequent second time T2, the signal $P_{1D}$ is also set to a high level, thus switching on the first switch circuit 405. It will be appreciated that in other embodiments, the first switch circuit 405 and the fourth switch circuit 500 may be switched on at the same time, e.g. a clock signal $P_1$ coupled to the gates of fifth transistor 505 and sixth transistor 510 and a clock signal coupled to the gates of first NMOS transistor 415 (and therefore also the respective complementary clock signals $P_{1B}$ and $P1_{DB}$) may comprise substantially the same phase.

In such a configuration, the sampling circuit 400 is configured in the sampling mode. That is, with the first switch circuit 405 and the fourth switch circuit 500 switched on and the second switch circuit 425 and the third switch circuit 450 switched off, a voltage at the input node 420 is sampled by sampling capacitor 445.

At a third time T3, the signal $P_1$ is set to a low level, e.g. a logic low level, thus switching the fourth switch circuit 500 off. As described above, due to the flip-around arrangement of the fifth transistor 505 and the sixth transistor 510, a charge injected by fifth and sixth transistors 505, 510 as they are switched off may be substantially symmetrically distributed across the respective sources and drains of the fifth and sixth transistors 505, 510. As such, the third and fourth dummy switches, e.g. the seventh transistor 515 and the eighth transistor 520 respectively, may accurately and reliably compensate for any such charge injected.

In a preferred embodiment, at a subsequent second time T4, the signal $P_{1D}$ is also set to a low level, thus switching off the first switch circuit 405. It will be appreciated that in other embodiments, the first switch circuit 405 and the fourth switch circuit 500 may be switched off at the same time.

In such a configuration, e.g. at time T4, the sampling circuit 400 is no longer configured in the sampling mode.

At a fifth time T5, the signal $P_{2B}$ is set to a high level, e.g. a logic high level, thus switching the third switch circuit 450 on. In a preferred embodiment, at a subsequent sixth time T6, the signal $P_{2DB}$ is also set to a high level, thus switching on the second switch circuit 425. It will be appreciated that in other embodiments, the first switch circuit 425 and the third switch circuit 450 may be switched on at the same time.

In such a configuration, the sampling circuit 400 is configured in the integration mode, effectively transferring charge accumulated in the sampling mode from the sampling capacitor 445 to the feedback capacitor 490.

At a seventh time T7, the signal $P_2$ is set to a low level, e.g. a logic low level, thus switching the third switch circuit 450 off. As described above, due to the flip-around arrangement of the first transistor 455 and the second transistor 460, a charge injected by first and second transistors 455, 460 as they are switched off may be substantially symmetrically distributed across the respective sources and drains of the first and second transistors 455, 460. As such, the first and second dummy switches, e.g. the third transistor 465 and the fourth transistor 470 respectively, may accurately and reliably compensate for any such charge injected.

In a preferred embodiment, at a subsequent eighth time T8, the signal $P_{2D}$ is also set to a low level, thus switching off the second switch circuit 425. It will be appreciated that in other embodiments, the third switch circuit 450 and the second switch circuit 425 may be switched off at the same time.

In such a configuration, e.g. at or immediately after time T8, the sampling circuit 400 is no longer configured in the integration mode.

It will be appreciated that in alternative embodiments, the first switch circuit 405 and/or the second switch circuit 425 may alternatively comprise a switch circuit 200 according to an embodiment of the disclosure, as depicted in FIG. 2. Furthermore, it will be appreciated that in alternative embodiments, the first switch circuit 405 and/or the second switch circuit 425 may alternatively comprise a charge-injection compensated circuit 300 as depicted in FIG. 3a, wherein said charge-injection compensated circuit 300 comprises one or both dummy switches, e.g. one or both of the third transistor 350 or the fourth transistor 355.

It will be appreciated that in some embodiments signals $P_1$ and/or $P_2$ and/or $P_{1D}$ and/or $P_{2D}$ may be clock signals. As shown in the example timing diagram depicted in FIG. 4b, each signal $P_1$ and/or $P_2$ and/or $P_{1D}$ and/or $P_{2D}$ may comprise a duty cycle that is less than 0.5. Furthermore, each of signals $P_1$ and/or $P_2$ and/or $P_{1D}$ and/or $P_{2D}$ may have the same or different phases.

Although the transistors shown in the appended figures are shown with three terminals, generally denoted source, drain and gate, it will be appreciated that one or more of said transistors may comprise a fourth terminal, wherein the fourth terminal is a base or substrate of the transistor. In an embodiment, the base or substrate of the transistors may be coupled to a source of the transistors. In yet another embodiment, the base or substrate may be coupled to a voltage reference, such as a ground reference, or 0V.

Figure 5:
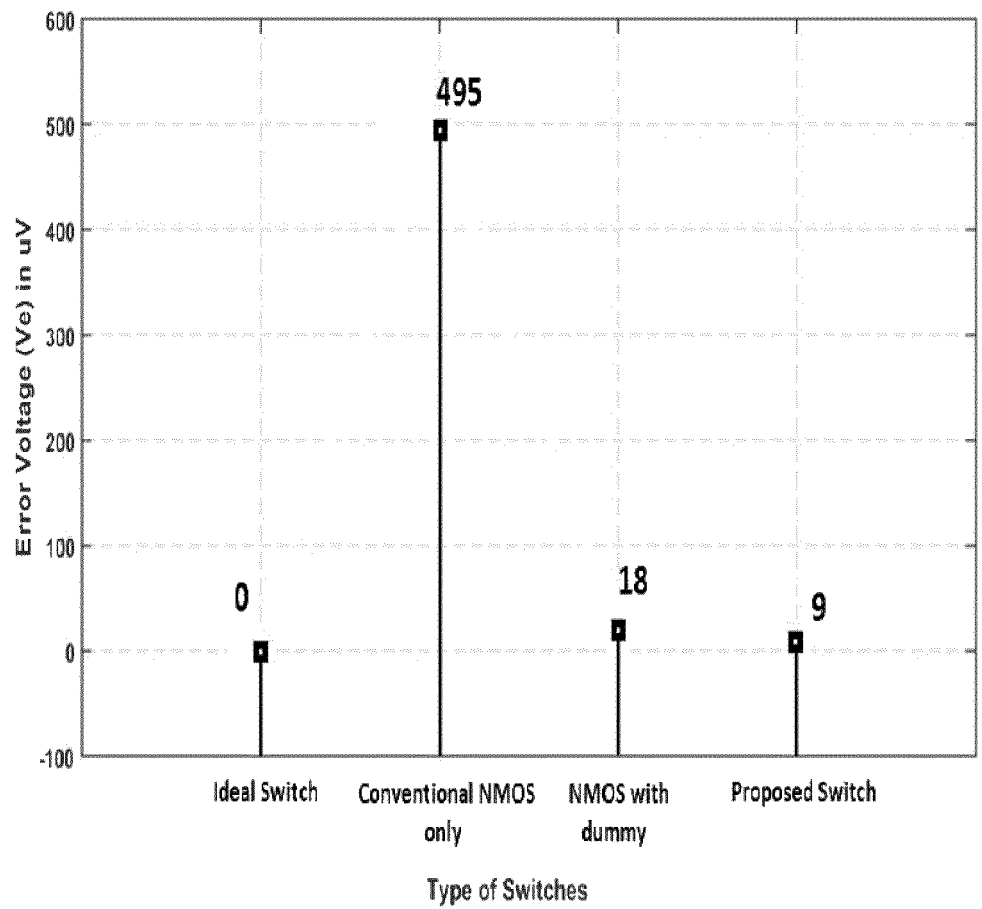

FIG. 5 is a chart showing a simulated performance of a switch circuit according to an embodiment of the disclosure relative to other circuits, including the prior art circuit of FIG. 1a.

The chart indicates a magnitude and polarity of an error voltage incurred, at least in part, to charge injected from transistors in various types of switch circuits.

In each case, switch size, capacitor value and fall time of the clock signal, each of which is selected based on specific system requirements, are maintained constant. For purposes of establishing a benchmark, the chart shows characteristics of an ideal switch, e.g. a switch that does not exhibit any charge-injection, incurs an associated error voltage of 0V.

A conventional NMOS transistor, e.g. a transistor without any associated charge-injection compensating circuitry, incurs an associated error voltage of 495 microvolts.

An NMOS transistor with an associated 'dummy switch', e.g. the circuit of FIG. 1a, incurs an associated error voltage of 18 microvolts.

A switch circuit according the an embodiment of the present disclosure incurs an associated error voltage of 9 microvolts.

That is, an error incurred in a sampling circuit employing a switch circuit according to an embodiment of the disclosure may be expected to be approximately half the magnitude of an error that may be incurred in a sampling circuit employing, for example, the prior art circuit of FIG. 1a for compensating for charge-injection.

Figure 6:
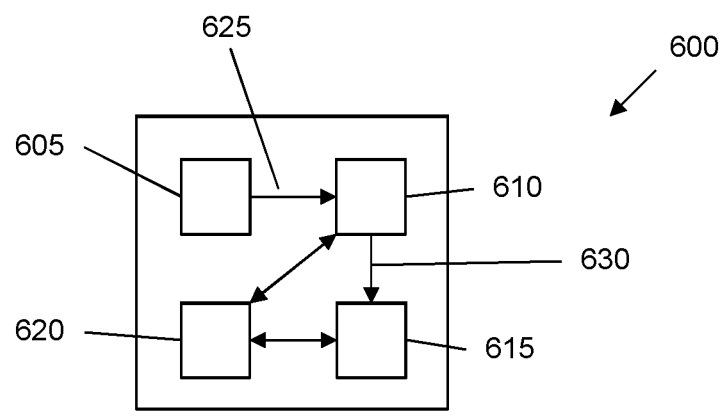
FIG. 6 depicts a light to frequency converter according to an embodiment of the invention.

FIG. 6 depicts a light to frequency converter 600 according to an embodiment of the disclosure. The light to frequency converter 600 comprises a light-sensitive element 605. In further embodiments, the light to frequency converter 600 may comprise a plurality of light-sensitive elements 605. The light sensitive element 605 may comprise a photodiode, such as a pinned photodiode or the like.

The light to frequency converter 600 also comprises a sampling circuit 610. The sampling circuit 610 may comprise at least one switch circuit 200 according to an embodiment of the disclosure. In a preferred embodiment, the sampling circuit 610 comprises at least one charge-injection compensated circuit 300 as described above with reference to FIG. 3a and FIG. 3b. The sampling circuit 605 is configurable to sample a signal 625 from the light-sensitive element 605.

In an embodiment, the light to frequency converter 600 comprises a storage device 615, such as a memory. The storage device 615 may be configured to store data 630 corresponding to a signal sampled by the sampling circuit 605.

In an embodiment, the light to frequency converter 600 comprises a further circuit 620, which may comprise a state machine, a central-processing unit, combinatorial logic, or the like. Further circuit 620 may comprise a digital circuit. The further circuit 620 may be configured to read and/or write data and/or instructions to/from the storage device 615. The further circuit 620 may be coupled to, such as communicably and/or cooperably coupled to, the sampling circuit 610. The further circuit 620 may be configured to control, operate or communicate with, the sampling circuit 610.

In an embodiment, the light to frequency converter 600 is an integrated circuit or integrated device, e.g. formed as a monolithic device on a substrate, such as a silicon substrate of the like.

Figure 7:
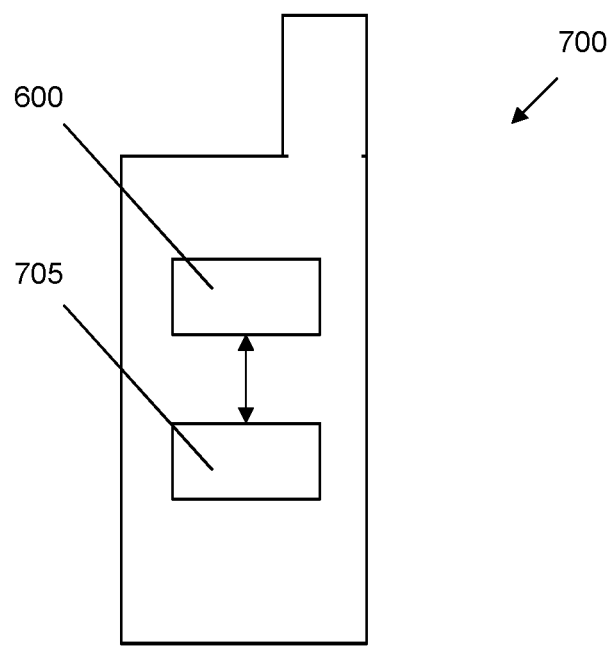
FIG. 7 depicts an optical device according to an embodiment of the invention.

FIG. 7 depicts an optical device 700 comprising at least one light to frequency converter 600 as described with reference to FIG. 6. The light to frequency converter 600 is communicably coupled to processor circuitry 705. The processor circuitry 705 is configured to receive a signal from the light to frequency converter 600 and/or provide a signal and/or power to the light to frequency converter 600. The optical device 700 is, for purposes of example only, a cellular telephone. It will be appreciated that, in other examples, the optical device 700 may be a digital camera, a security camera, a laptop or tablet device, an image recording device, or the like.

FIGS. 8a to 8g depict an example layout of the charge-injection compensated circuit of FIG. 3a. The layout of FIGS. 8a to 8g corresponds to a layout in an integrated circuit, such as a semiconductor device. In particular, FIGS. 8a to 8g depict layers that may form the charge-injection compensated circuit of FIG. 3a in an integrated circuit.

Figure 8A:
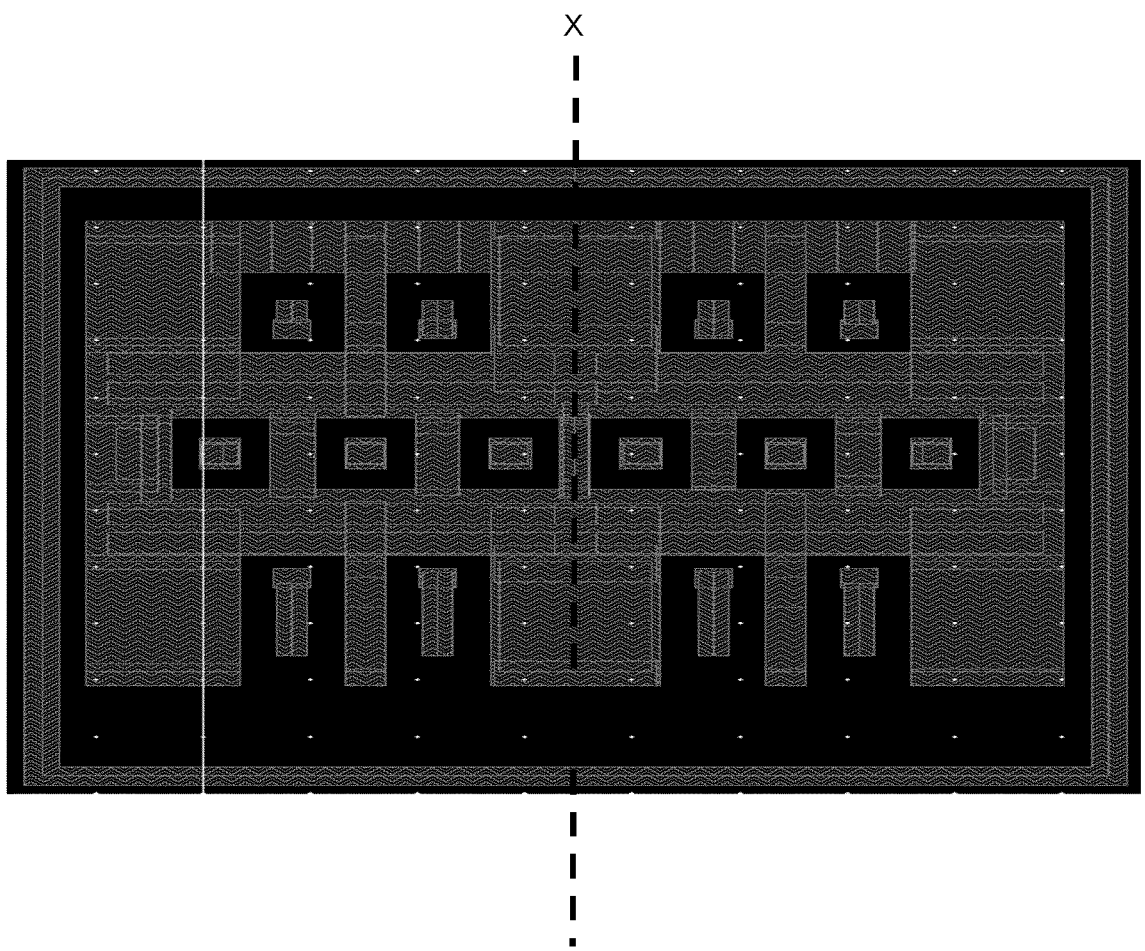

FIG. 8a depicts a metal layer in an example of a layout of the charge-injection compensated circuit of FIG. 3a. The metal layer may be formed on a substrate. As can be seen from FIG. 8a, the metal layer is substantially symmetrical about an axis X.

Figure 8B:
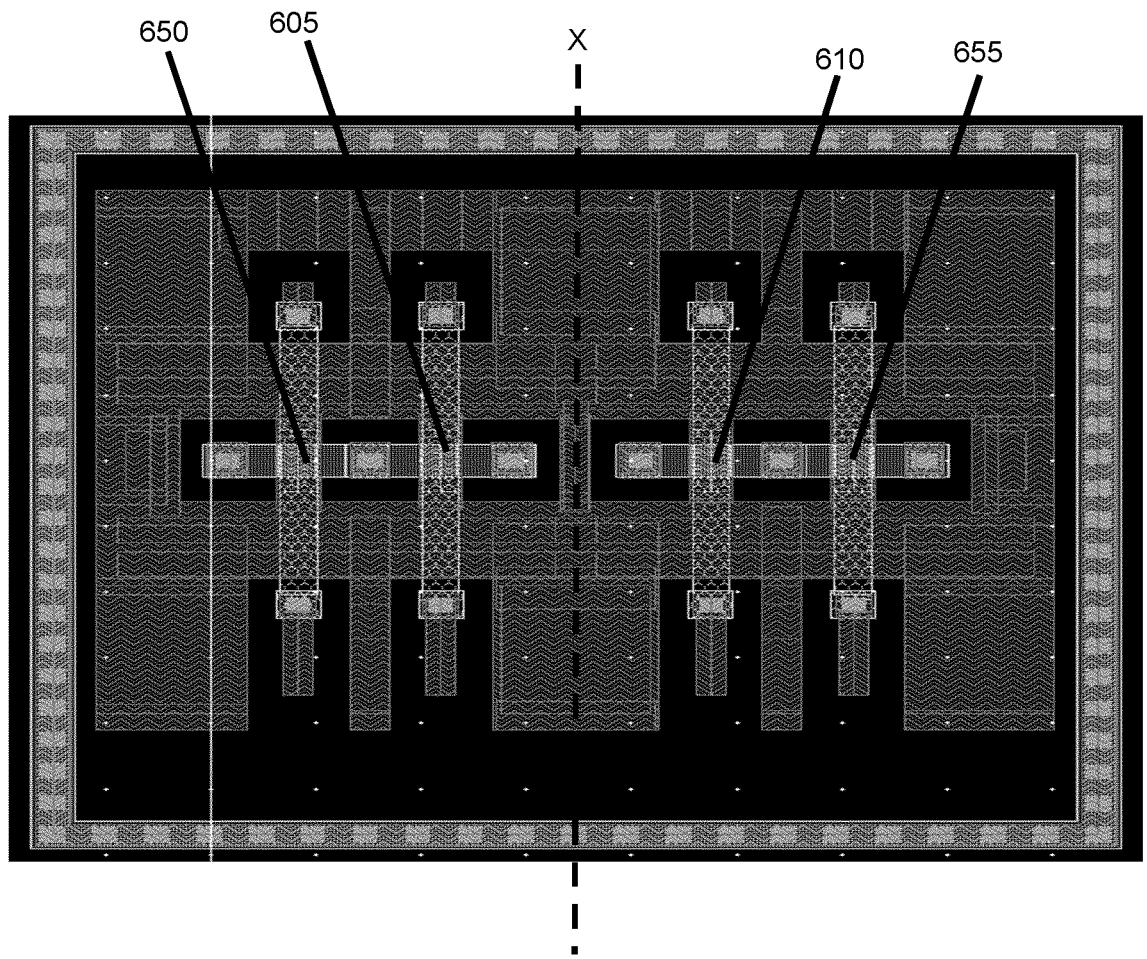

FIG. 8b depicts the metal layer of FIG. 8a, with an additional contacts and diffusion regions formed on the metal layer, thus defining four basic transistors, 805, 810, 850, 855. The contacts and diffusion regions are arranged substantially symmetrically about the axis X. In particular, FIG. 8b shows an example layout of four transistors 805, 810, 850, 855 which could be applied to the charge-injection compensated circuit of FIG. 3a. Connectivity between the transistors 805, 810, 850, 855 to form a charge-injection compensated circuit equivalent to that of FIG. 3a is not shown in FIG. 8b. For example, connectivity between a source of the transistor 805 and a drain of the transistor 810, and also connectivity between a drain of the transistor 805 and a source of the transistor 810 is not shown in FIG. 8b. In an embodiment, such connectivity between the four transistors 805, 810, 850, 855 to form the charge-injection compensated circuit of FIG. 3a may be implemented by means of one or more further metal layers, for example as described below with reference to FIGS. 8c to 8g.

Figure 8C:
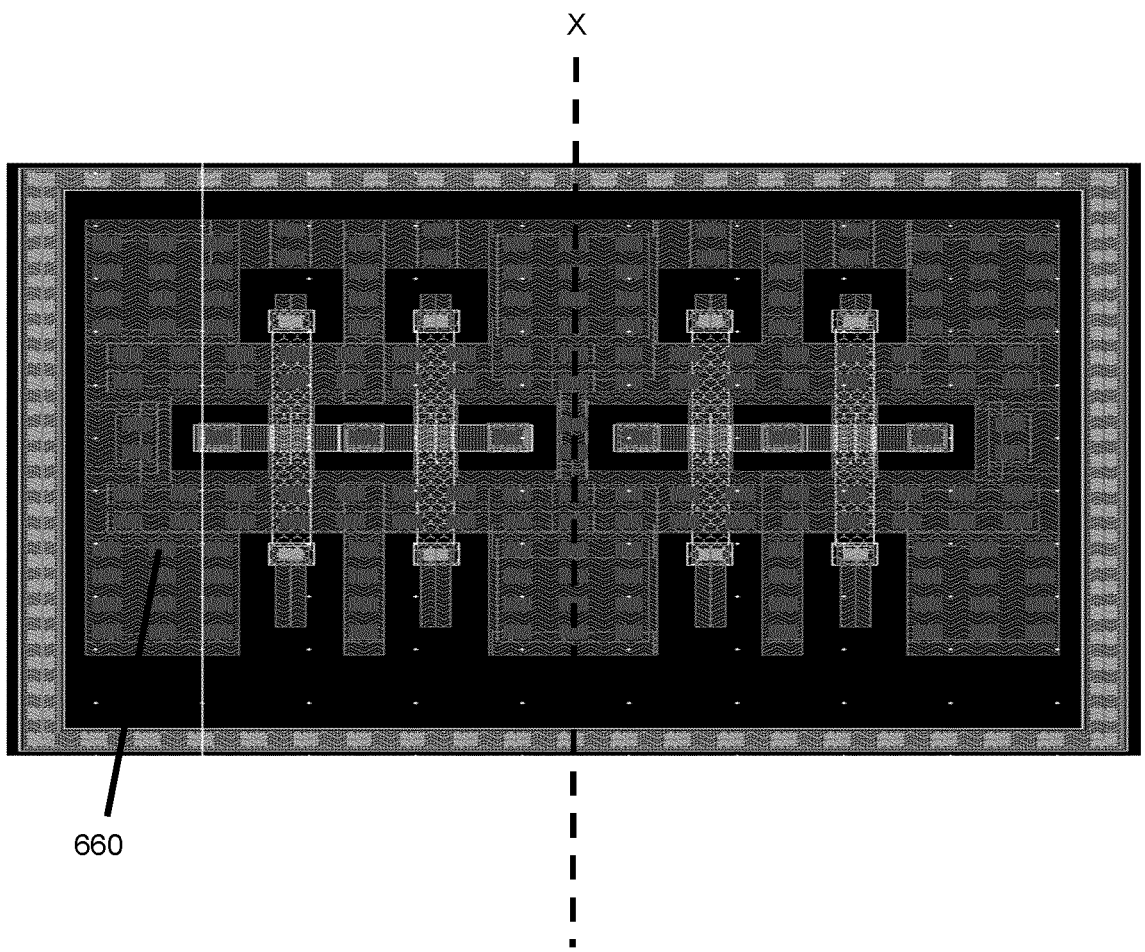

FIG. 8c corresponds to the layout of FIG. 8b with an additional layer of vias 860. The vias 860 are arranged substantially symmetrically about the axis X. In an example embodiment, the layer of vias 860 may be formed in a metal layer.

Figure 8D:
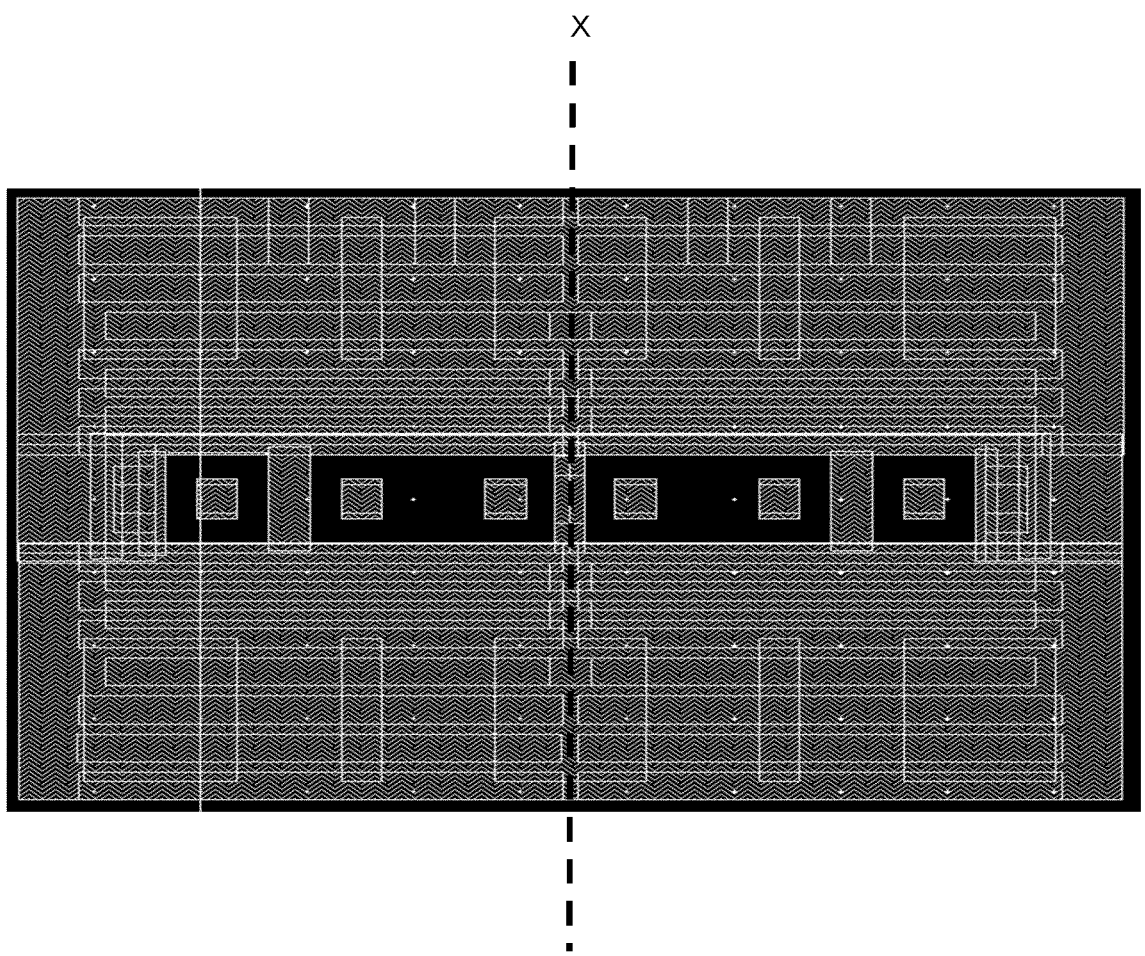
Figure 8E:
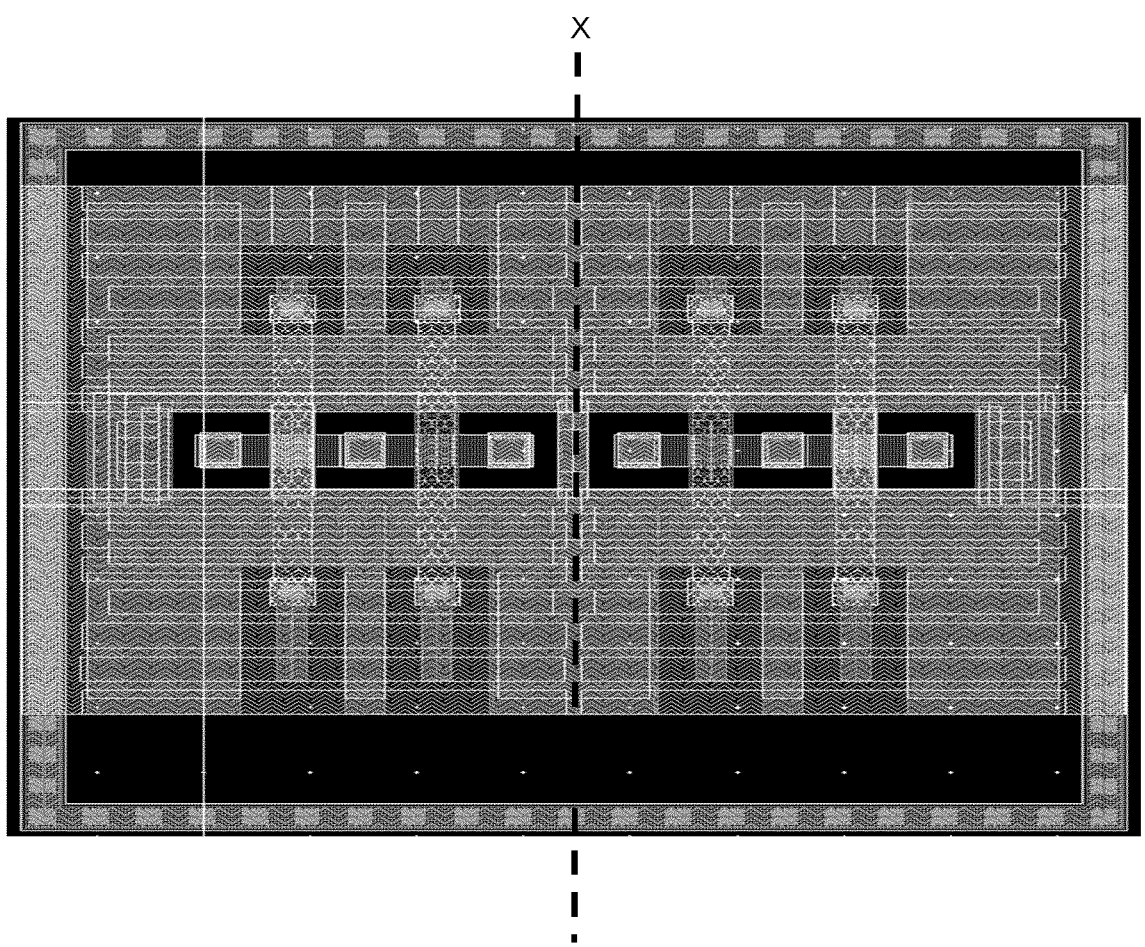

FIG. 8d depicts a further metal layer. FIG. 8e corresponds to the further metal layer of FIG. 8d formed over the layout of FIG. 8c. The further metal layer of FIG. 8d is arranged substantially symmetrically about the axis X.

Figure 8F:
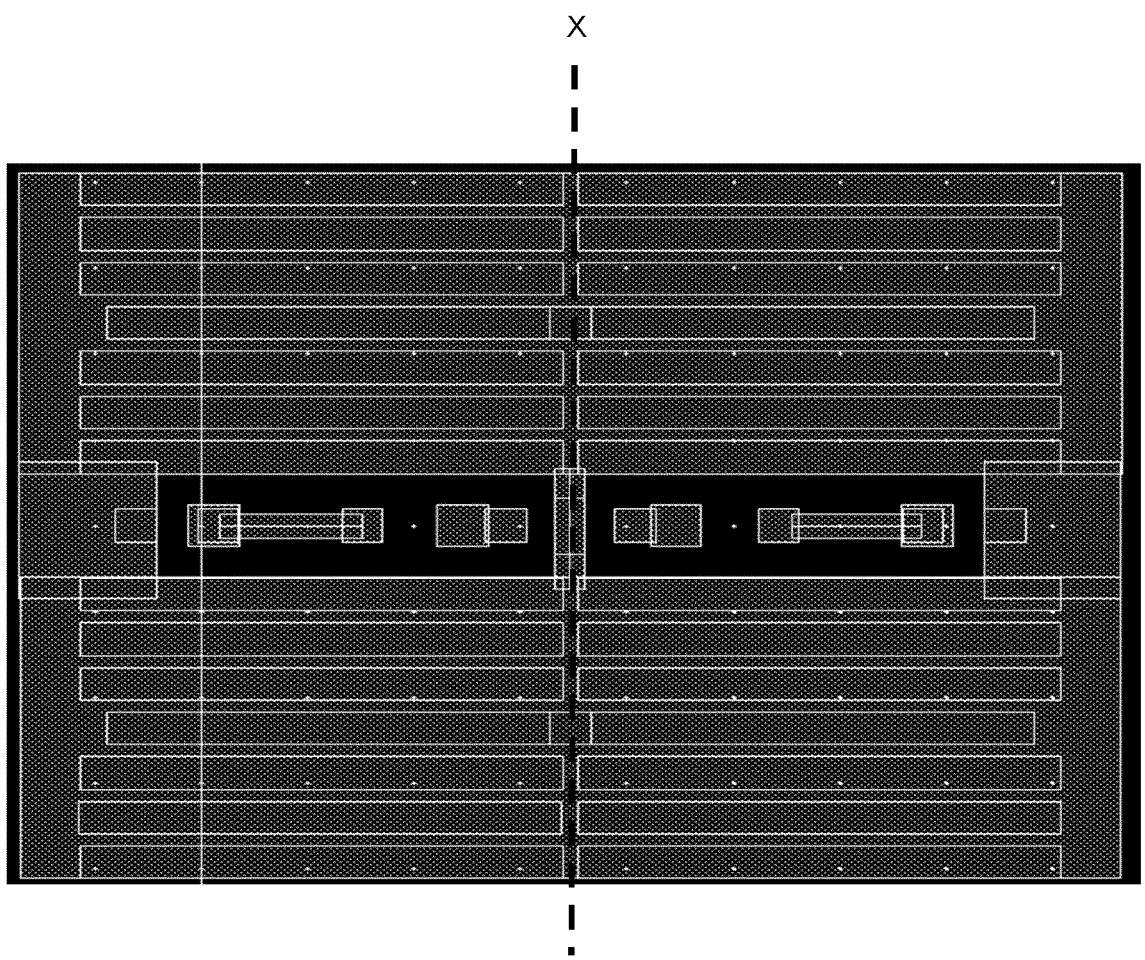
Figure 8G:
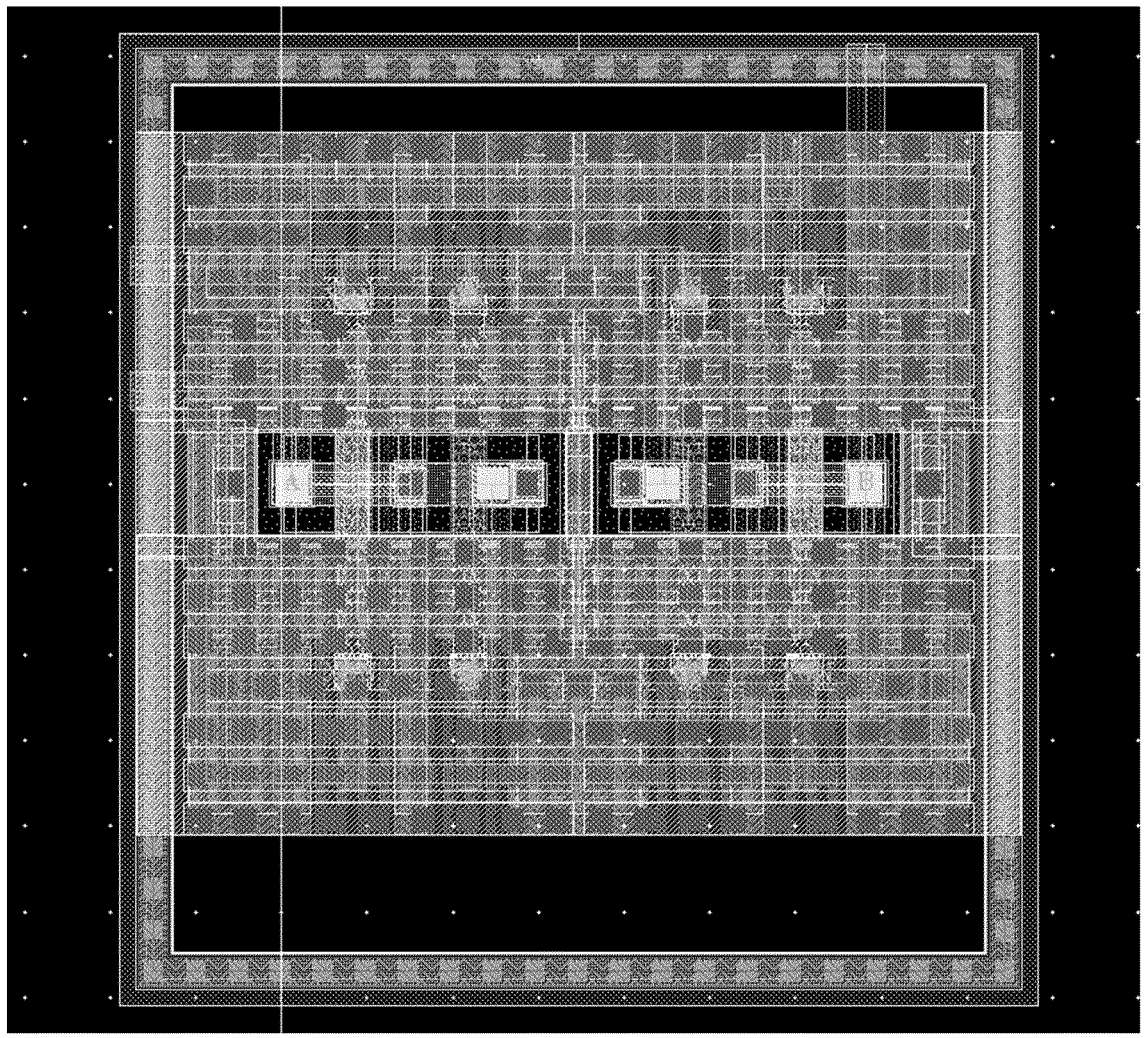

Similarly, FIG. 8f depicts another metal layer and FIG. 8g corresponds to a layout comprising the other metal layer of FIG. 8f formed over the layout of FIG. 8e. For purposes of brevity, any additional via layers between any of the metal layers are not shown.

It will be appreciated that FIG. 8g is an example of a layout showing transistors 805, 810, 850, 855 generally corresponding to transistors 205, 210, 350, 355, laid out in a substantially symmetrical arrangement. Also shown in FIG. 8g is a substantially symmetrical routing between the transistors, to mitigate any influence of asymmetric parasitic capacitance and/or inductance in the circuit.

Furthermore, it will be appreciated that layers described with reference to FIGS. 8a to 8g are provided for purposes of example only. In other embodiments falling within the scope of the disclosure, additional and/or alternative layers may be implemented. For example, further embodiments may comprise additional and/or alternative metal layers to connect the four transistors 805, 810, 850, 855 to implement the charge-injection compensated circuit of FIG. 3a.

The applicant discloses in isolation each individual feature described herein and any combination of two or more such features, to the extent that such features or combinations are capable of being carried out based on the specification as a whole in the light of the common general knowledge of a person skilled in the art, irrespective of whether such features or combinations of features solve any problems disclosed herein, and without limitation to the scope of the claims. The applicant indicates that aspects of the disclosure may consist of any such individual feature or combination of features. In view of the foregoing description it will be evident to a person skilled in the art that various modifications may be made within the scope of the disclosure.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS

| | | | |
|---|---|---|---|
| 100 | circuit | 210 | second transistor |
| 105 | first transistor | 210s | source |
| 110 | input node | 210g | gate |
| 115 | output node | 210d | drain |
| 120 | capacitor | 215 | first node |
| 125 | charge | 220 | second node |
| 130 | charge | 225 | charge |
| 135 | second transistor | 230 | charge |
| 140 | charge | 235 | charge |
| 150 | circuit | 240 | charge |
| 155 | NMOS transistor | 245 | third node |
| 160 | PMOS transistor | 300 | circuit |
| 165 | input node | 350 | third transistor |
| 170 | output node | 355 | fourth transistor |
| 175 | charge | 370 | layout |
| 180 | charge | 400 | sampling circuit |
| 185 | voltage reference | 405 | first switch circuit |
| 200 | circuit | 410 | first PMOS transistor |
| 205 | first transistor | 415 | first NMOS transistor |
| 205s | source | 420 | input node |
| 205g | gate | 425 | second switch circuit |
| 205d | drain | 430 | second PMOS transistor |
| 435 | second NMOS transistor | 610 | sampling circuit |
| 440 | first voltage reference | 615 | storage device |
| 445 | sampling capacitor | 620 | further circuit |
| 445a | first terminal | 625 | signal |
| 445b | second terminal | 630 | data |
| 450 | third switch circuit | 700 | optical device |
| 455 | first transistor | 705 | processor circuitry |
| 460 | second transistor | 805 | transistor |
| 465 | third transistor | 810 | transistor |
| 470 | fourth transistor | 850 | transistor |
| 480 | integrator circuit | 855 | transistor |
| 485 | operational amplifier | 860 | vias |
| 490 | feedback capacitor | T0 | initial time |
| 500 | fourth switch circuit | T1 | first time |
| 505 | fifth transistor | T2 | second time |
| 510 | sixth transistor | T3 | third time |
| 515 | seventh transistor | T4 | fourth time |
| 520 | eighth transistor | T5 | fifth time |
| 525 | second voltage reference | T6 | sixth time |
| 600 | light to frequency converter | T7 | seventh time |
| 605 | light-sensitive element | T8 | eighth time |

The invention claimed is:

1. A switch circuit comprising:
a first transistor; and
a second transistor having a same channel-type as the first transistor,
wherein:
a first node is connected to a source of the first transistor and a drain of the second transistor,
a second node is connected to a drain of the first transistor and a source of the second transistor,
routing from the drain of the first transistor toward the second node is substantially symmetrical with routing from the source of the second transistor toward the second node, and
routing from the source of the first transistor toward the first node is substantially symmetrical with routing from the drain of the second transistor toward the first node.

2. The switch circuit of claim 1, wherein a third node is connected to a gate of the first transistor and to a gate of the second transistor.

3. The switch circuit of claim 2, wherein the third node is coupled to an enable signal for configuring the first transistor and the second transistor to selectively couple the first node to the second node.

4. The switch circuit of claim 1 wherein the first transistor is configured to exhibit substantially the same electrical characteristics as the second transistor and/or the first transistor comprises substantially a same gate area as the second transistor.

5. The switch circuit of claim 3 comprising a third transistor, wherein a source of the third transistor and a drain of the third transistor are connected to the first node or to the second node.

6. The switch circuit of claim 5 comprising a fourth transistor, wherein a source of the fourth transistor and a drain of the fourth transistor are connected to the other of the first node or the second node.

7. The switch circuit of claim 6, wherein a gate of the fourth transistor and/or a gate of the third transistor is coupled to signal corresponding to an inverse of the enable signal.

8. The switch circuit of claim 1 wherein the channel-type is n-channel.

9. A sampling circuit comprising:
a first switch circuit according to claim 1; and
a sampling capacitor,
wherein the first switch circuit is configurable to electrically couple the sampling capacitor to an integrator circuit or to a voltage reference.

10. The sampling circuit of claim 9 further comprising:
a second switch circuit configurable to electrically couple the sampling capacitor to the other of the integrator circuit or the voltage reference.

11. The sampling circuit of claim 9 comprising the integrator circuit, wherein the integrator circuit comprises an operational-amplifier coupled to a feedback capacitor.

12. An integrated circuit device comprising at least one switch circuit according to claim 1.

13. The integrated circuit device of claim 12, wherein the first and second transistors of the at least one switch circuit are arranged substantially linear-symmetrically or point-symmetrically relative to one another.

14. The integrated circuit device of claim 12 comprising a plurality of further transistors, each of the further transistors having a gate area, wherein the first and second transistors of the at least one switch circuit each have a gate area approximately equally to half of the gate area of each transistor of the plurality of further transistors.

15. The integrated circuit device of claim 12, wherein the first transistor of the at least one switch circuit is fabricated with source and drain terminals that are distinct from fabricated source and drain terminals of the second transistor of the at least one switch circuit.

16. A light to frequency converter or light sensor comprising:
at least one light-sensitive element; and
at least one sampling circuit according to claim 9,
wherein the at least one sampling circuit is configurable to sample a signal from the at least one light-sensitive element.

17. An optical device comprising at least one light to frequency converter or light sensor according to claim 16, wherein the optical device is at least one of: a cellular telephone, a camera, an image-recording device; and/or a video recording device.

\* \* \* \* \*